(12) United States Patent
Ostermayr et al.

(10) Patent No.: US 7,327,593 B2
(45) Date of Patent: Feb. 5, 2008

(54) ROM MEMORY CELL HAVING DEFINED BIT LINE VOLTAGES

(75) Inventors: Martin Ostermayr, Feldkirchen (DE); Thomas Nirschl, Essex Junction, VT (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/284,092

(22) Filed: Nov. 22, 2005

(65) Prior Publication Data

US 2006/0152958 A1    Jul. 13, 2006

(30) Foreign Application Priority Data

Nov. 23, 2004  (DE) .................. 10 2004 056 459

(51) Int. Cl.
*G11C 17/00* (2006.01)
(52) U.S. Cl. .......................... 365/94; 365/63
(58) Field of Classification Search ............... 365/94
See application file for complete search history.

(56) References Cited

U.S. PATENT DOCUMENTS 4,165,538 A * 8/1979 Kitamura ............... 365/185.24
2002/0179999 A1 * 12/2002 Lee et al. .................. 257/530

FOREIGN PATENT DOCUMENTS

DE          10156742 A1     6/2003
EP          0206229 A2     12/1986

* cited by examiner

*Primary Examiner*—Amir Zarabian
*Assistant Examiner*—Jason Lappas
(74) *Attorney, Agent, or Firm*—Patterson & Sheridan, L.L.P.

(57) ABSTRACT

The invention relates to a ROM memory cell of a ROM memory, which provides a first predetermined potential or a second predetermined potential in the driven state at a memory cell output in a manner dependent on the programming state of the ROM memory cell.

12 Claims, 10 Drawing Sheets

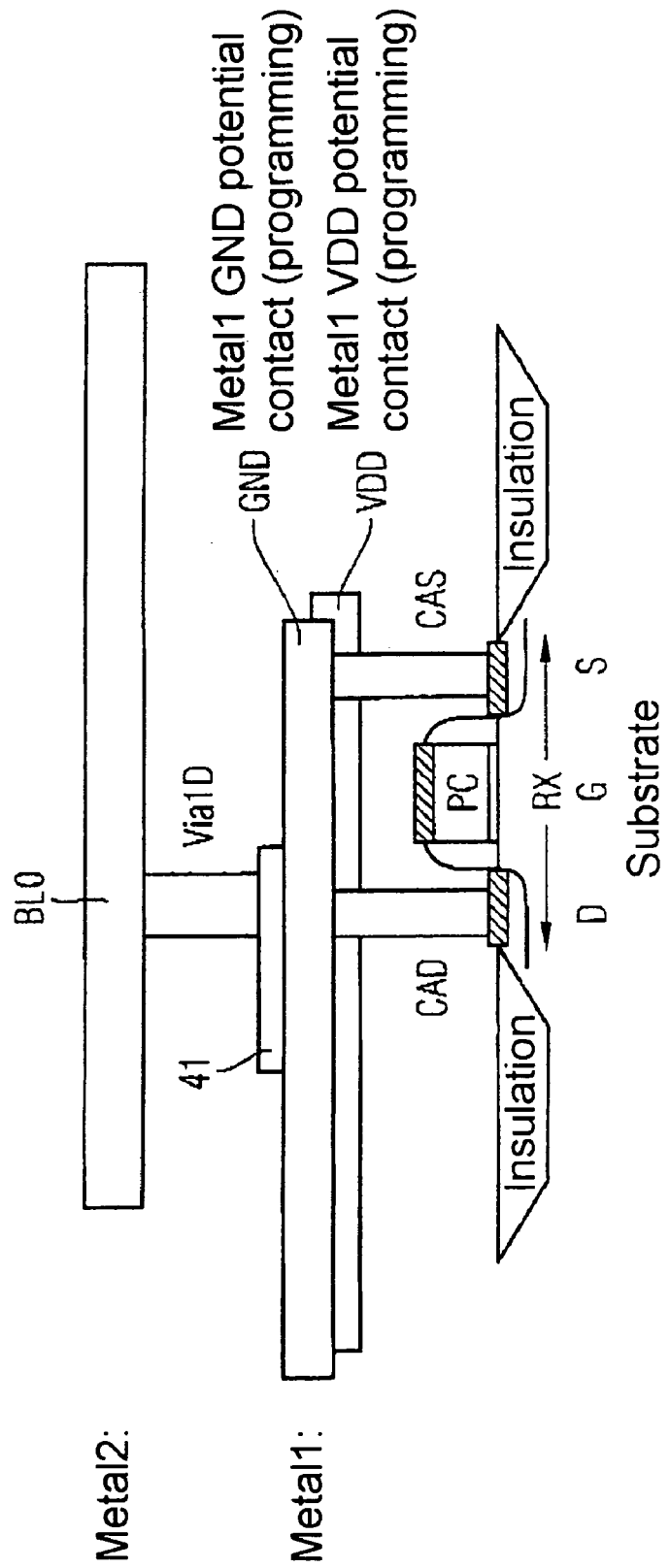

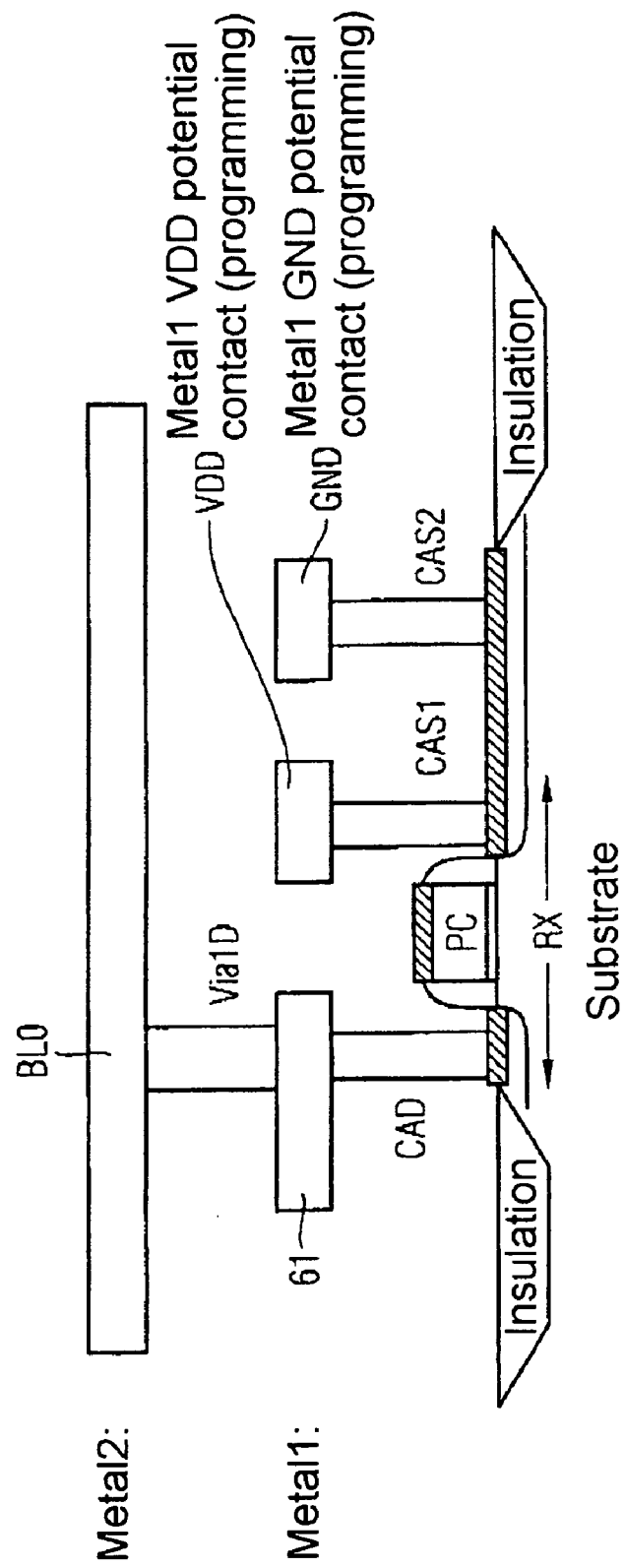

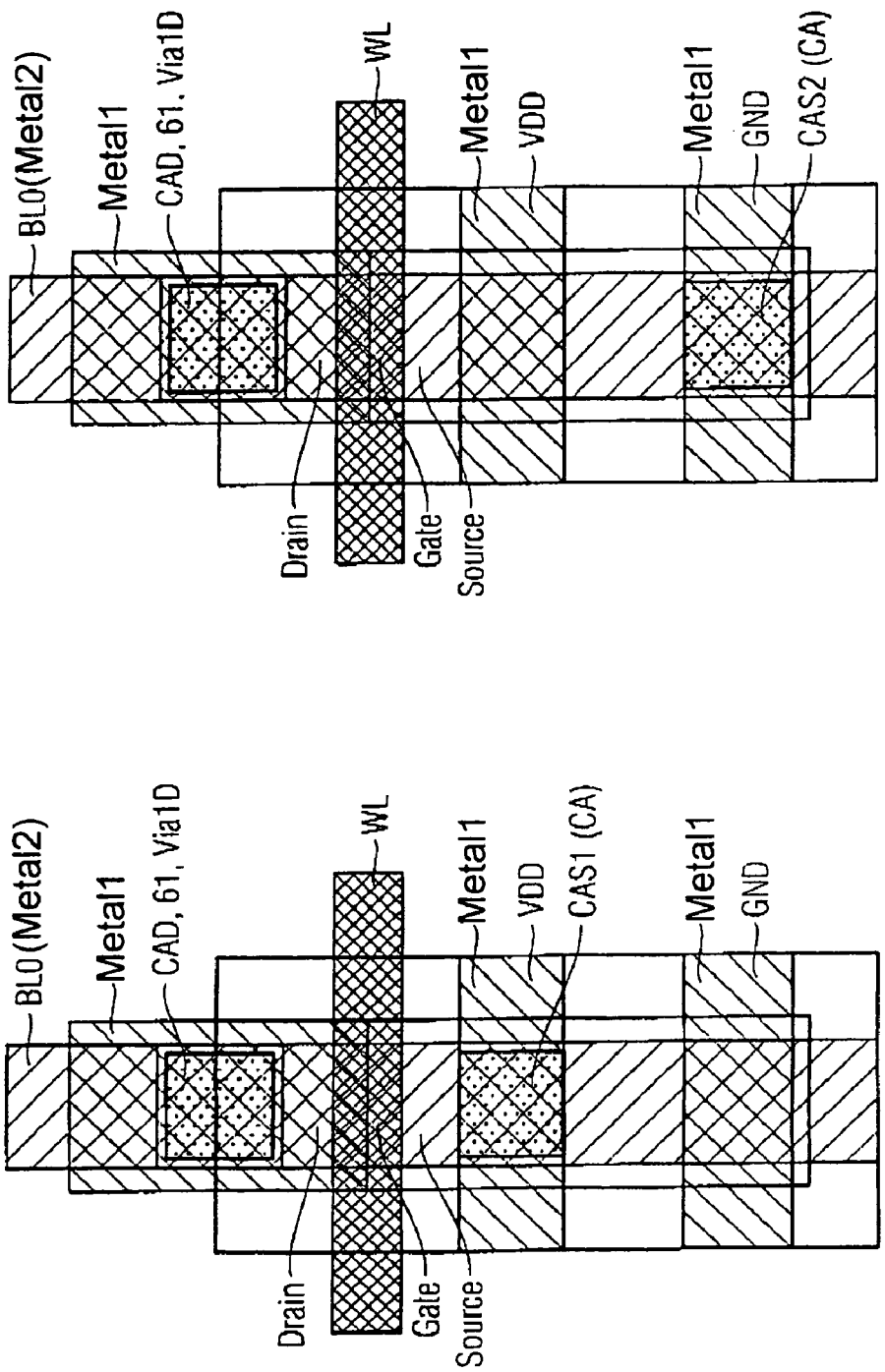

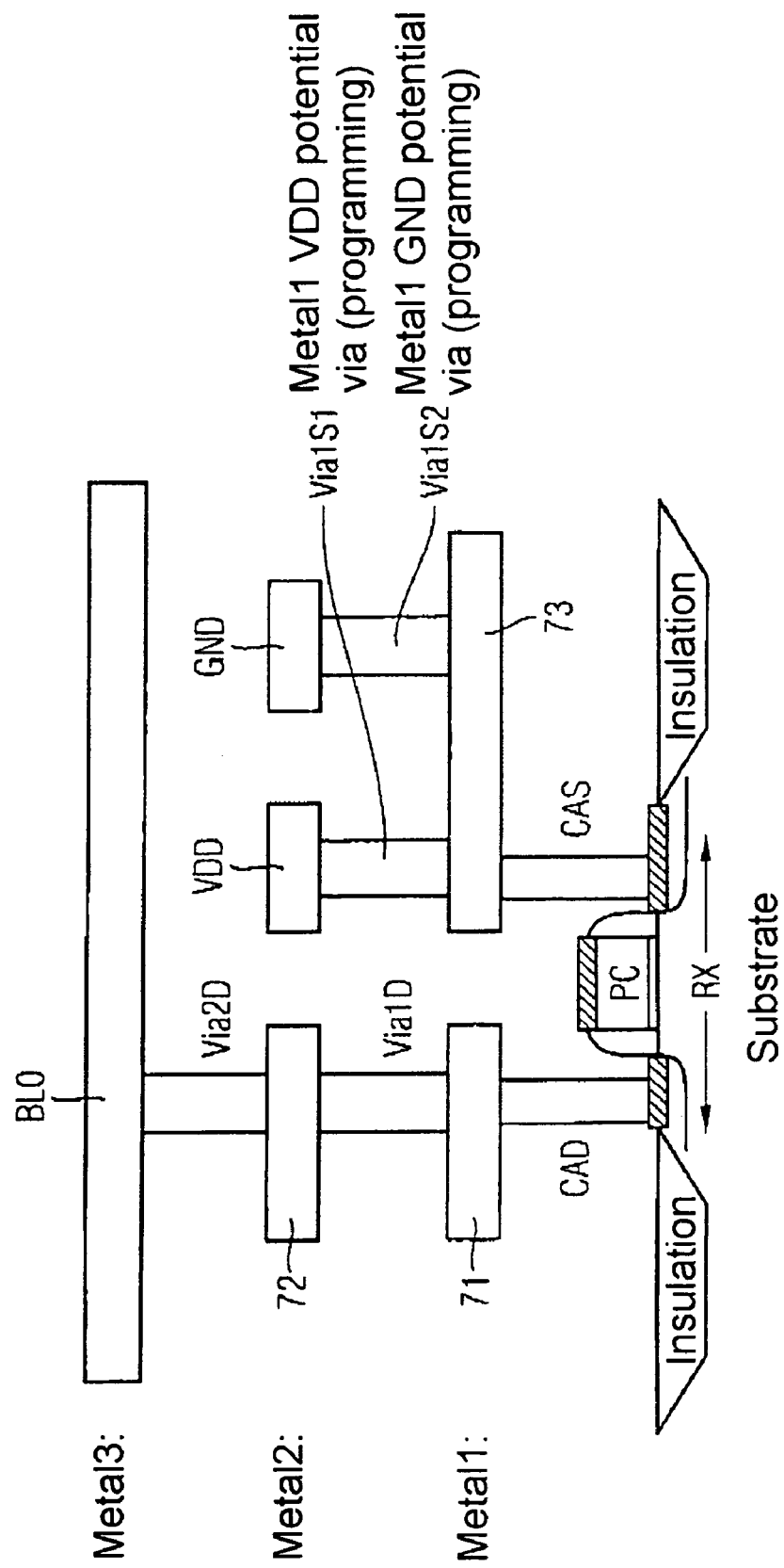

US 7,327,593 B2

ROM MEMORY CELL HAVING DEFINED BIT LINE VOLTAGES

CLAIM FOR PRIORITY

This application claims the benefit of prior German Application No. 10 2004 056 459.0, filed in the German language on Nov. 23, 2004, the contents of which are hereby incorporated by reference

TECHNICAL FIELD OF THE INVENTION

The invention relates to a ROM memory cell, a ROM memory having at least one ROM memory cell, and also a method for fabricating ROM memory cells.

BACKGROUND OF THE INVENTION

In digital systems, items of information are stored in memory cells, such as in ROM (Read-Only Memory) memory cells, for example. Depending on the memory requirement, individual ROM memory cells can be used for this purpose, but in general ROM memories having arrangements (arrays) of ROM memory cells with crossed word and bit lines are used. The ROM memory cells are situated at the crossover points of word and bit lines and have a defined programming state, that is to say that they represent a logic 0 or a logic 1, for example. Programmable ROMs are known, in the case of which the programming state can be impressed on the ROM memory cells during an explicit programming step after fabrication, and mask-programmable ROMs are also known, in the case of which the programming state is defined during a specific fabrication step of the semiconductor component or of the integrated circuit which has the ROM memory cells. In general, mask-programmable ROMs cannot be reprogrammed after fabrication.

FIG. 1a illustrates a ROM memory cell in accordance with the prior art. The ROM memory cell has a switching element in the form of an NMOS transistor, the source region of which is connected to earth GND and the gate region of which is connected to a word line WL. If a suitable signal is applied to the word line WL, then the transistor switches "on", that is to say that the source region of the transistor is conductively connected to the drain region of the transistor and the drain region is connected to earth GND. In the present example, earth GND represents a logic 0 and a supply voltage VDD (not illustrated) represents a logic 1. The programming of the ROM memory cell takes place by virtue of the fact that the drain region of the transistor is or is not connected to a bit line BL0. In FIG. 1a, the drain region is connected to the bit line BL0 via an electrical connection 21, so that the ROM memory cell from FIG. 1a has the programming state logic 0.

In order to read out the items of information from a ROM memory having an arrangement (array) of ROM memory cells illustrated in FIG. 1a, a row of ROM memory cells is driven via a word line WL by the application of a suitable signal to the word line WL. The various ROM memory cells of the driven row are or are not connected to a respective bit line BL0 via the electrical connection 21 in accordance with their programming state. The ROM memory cell from FIG. 1a has the programming state logic 0 and connects the bit line BL0 to earth GND in the driven state. If the ROM memory cell has a programming state corresponding to a logic 1, then the electrical connection 21 is not formed, and the potential of the bit line BL0 is not altered by the ROM memory cell in the driven state.

Prior to the read-out, all the bit lines which are connected to the row of ROM memory cells to be read are firstly set to the potential VDD, for example, which corresponds to the logic 1. Depending on the system architecture, the bit lines may also be precharged to VDD/2 or earth GND. Directly prior to the driving of the row of ROM memory cells to be read and the read-out of the programming states of these ROM memory cells, the applied potential is decoupled from the bit lines and there remains on the bit lines a charge which leaves the latter essentially at the previously applied potential.

It is assumed below that the bit lines are precharged to the potential VDD. If the driven ROM memory cell assigned to a given bit line has the programming state logic 0, then the charge on the bit line is dissipated via the transistor of the ROM memory cell and the bit line essentially assumes the earth potential GND or the potential GND+$V_{th}$, where $V_{th}$ is the voltage drop along the transistor of the ROM memory cell. If the driven ROM memory cell has the programming state logic 1, then the charge remains on the bit line and the bit line essentially retains the precharged potential VDD.

In other system architectures, the bit lines are precharged to earth GND and, during read-out, in a first programming state of the driven transistor, charge flows onto the bit line and charges the latter to the potential VDD, for example. In a second programming state of the driven transistor, the bit line is not charged and it remains at the earth potential GND.

There is in each case a sense amplifier situated on the various bit lines, which sense amplifier senses the voltage of the respective bit line BL0 and determines from this the programming state of the driven ROM memory cell.

FIG. 1b shows a plan view of the layer structure of the ROM memory cell illustrated schematically in FIG. 1a. The word line WL runs horizontally in FIG. 1b, is formed from polysilicon and crosses a diffusion region, thus giving rise to a transistor with a source, gate and drain region. In order to improve the electrical properties of the word line WL formed from polysilicon, a metallic interconnect WL' may additionally be provided, WL and WL' being electrically connected at specific intervals (not illustrated). The source region of the transistor is connected to earth GND, it being possible for the earth line to be designed as a diffusion region. In order to improve the electrical properties, the earth line may additionally be provided with a further metallic interconnect. The bit line BL0 is designed as a metallic interconnect and runs vertically in FIG. 1b. The programming of the ROM memory cell takes place via a contact connection 21, which is or is not formed in accordance with the programming state of the ROM memory cell. The contact connection 21 connects the drain region of the transistor to the bit line BL formed in the metallization layer Metal 1. If the ROM memory cell is intended to assume the programming state logic 0, then the contact connection 21 is formed, as is illustrated in FIG. 1b. If the ROM memory cell is intended to assume the programming state logic 1, then the contact connection 21 is not formed, and the transistor of the ROM memory cell is not electrically connected to the bit line BL0.

The ROM memory may also be of the opposite construction in terms of voltage technology. In the ROM memory cells, a PMOS transistor is then used instead of the NMOS transistor, the source region of the transistor is connected to the supply voltage VDD instead of to earth GND, and the bit lines have the earth potential GND directly prior to the driving of a row of ROM memory cells to be read.

FIG. 2 illustrates the layer structure of a further ROM memory cell that is known in the prior art. This ROM memory cell is largely identical to the ROM memory cell discussed above. Parts having essentially similar functions are provided with the same reference symbols as in FIG. 1b. In contrast to the previous ROM memory cell, the contact connection 21 is always formed, independently of the intended programming state. In the case of this ROM memory cell, the programming takes place in a different production step. In accordance with the intended programming state, a diffusion region 22 is or is not formed below the word line WL. Consequently, a complete and functional transistor is formed only in one of the two possible programming states. In terms of voltage technology, this "diffusion-programmed" ROM memory cell behaves similarly to the ROM memory cell illustrated in FIGS. 1a and 1b.

The published patent application DE 101 56 742 A1 discloses a further embodiment of a ROM memory cell. In this case, the programming takes place by means of an electrical connection between the source region of the transistor of the ROM memory cell and the earth line, which is or is not formed in a manner dependent on the intended programming state. In terms of voltage technology, this ROM memory cell behaves similarly to the two previously discussed known ROM memory cells from the prior art.

What is disadvantageous about the ROM memory cells known from the prior art is the relatively high outlay required to distinguish between the two programming states during read-out, said programming states being represented on the one hand by a defined potential (e.g. $GND+V_{th}$) and on the other hand by a potential which is not defined (biased) on a bit line. This requires a narrow sensing window, is relatively slow with regard to the read-out speed (performance) and makes the ROM memory, particularly in the case of potentials which are not defined (floating) on the bit lines, susceptible to crosstalk (or x-talk).

SUMMARY OF THE INVENTION

The invention discloses a ROM memory cell which permits the construction of a ROM memory having improved read-out properties. Furthermore, the invention discloses a corresponding ROM memory and also a method for programming a ROM memory cell according to the invention.

In one embodiment of the invention, the drivable ROM memory cell has a memory cell output as a read output. If the ROM memory cell is driven via a word line, for example, it provides a first predetermined potential or a second predetermined potential at the memory cell output in a manner dependent on the programming state of the ROM memory cell. In the non-driven state, no predetermined potential is provided at the memory cell output. The predetermined potential provided in the driven state represents the programming state of the ROM memory cell.

The ROM memory cell may be designed as a mask-programmed ROM memory cell, in which the programming state of the ROM memory cell is defined in a production step for the ROM memory cell, or as a programmable ROM memory cell, in which the programming state is defined after production in an explicit programming step.

The ROM memory cell according to the invention provides a predetermined defined potential in the driven state at the memory cell output in each programming state. In contrast thereto, the ROM memory cells known from the prior art provide a defined potential (for example the earth potential) only in one of the (two) programming states.

The programming state of a ROM memory cell is determined by a sensing unit connected to the memory cell output. A sensing unit connected downstream of the ROM memory cell according to the invention has to distinguish between two defined, predetermined potentials in order to determine the programming state of the ROM memory cell. By contrast, a sensing unit connected downstream of a ROM memory cell known from the prior art has to distinguish between the presence and the absence of a predetermined potential at the memory cell output, which is disadvantageous in terms of circuitry.

The sensing unit uses sensing windows to distinguish between the programming states, which sensing windows define voltage ranges with the aid of which a measured voltage is assigned to a programming state. In the sensing unit connected downstream of a ROM memory cell according to the invention, it is possible, owing to the exclusive presence of defined and generally distinctly different potentials, for the sensing windows to be designed to be larger than in the case of a sensing unit connected downstream of a ROM memory cell in accordance with the prior art. This permits the measured voltage provided at the memory cell output to be assigned more rapidly to one of the programming states and thus enables an overall faster and more reliable read-out of the ROM memory cell.

In accordance with another embodiment of the ROM memory cell according to the invention, the memory cell comprises a switching element having a signal input and a signal output. The signal input is fixedly electrically connected either to the first predetermined potential or to the second predetermined potential in a manner dependent on the programming state of the ROM memory cell. In the driven state of the ROM memory cell, the switching element is closed and the signal output is electrically connected to the signal input. In the non-driven state, the switching element is open and the signal output is electrically isolated from the signal input. In the driven state, the predetermined potential provided at the signal output represents the programming state of the ROM memory cell and the signal output can be used for reading out the programming state of the ROM memory cell.

In an advantageous manner, the signal output of the switching element is fixedly connected to the memory cell output of the ROM memory cell.

In accordance with a further embodiment of the ROM memory cell according to the invention, the switching element has a control input. A suitable control signal can be applied to the latter, as a result of which the ROM memory cell is driven or put into the driven state and, in particular, the switching element is closed. In the driven state, the switching element switches on and the signal output is electrically connected to the signal input.

Preferably, the first predetermined potential represents a logic 1 and the second predetermined potential represents a logic 0. In particular, a supply voltage forms the first predetermined potential and the earth potential forms the second predetermined potential.

In still another embodiment of the ROM memory cell according to the invention, the memory cell comprises a first and a second interconnect, to which the first predetermined potential and the second predetermined potential are respectively applied. In a manner dependent on the programming state of the ROM memory cell, the signal input of the switching element of the ROM memory cell is electrically connected to the first or the second interconnect. The interconnects are metallic interconnects, in particular, which are arranged in particular in the metallization layers of an integrated circuit comprising the ROM memory cell according to the invention.

It may advantageously be provided that the first and second interconnects are arranged in a first metallization layer of the integrated circuit. The two interconnects are situated in the same metallization layer. The first metallization layer is arranged above the switching element of the ROM memory cell, which is arranged in the semiconductor layers lying below the metallization layers. In an advantageous manner, the first and second interconnects are essentially arranged above the ROM memory cell.

In yet another embodiment of the ROM memory cell according to the invention, the memory cell comprises a first electrical connection, the top side of which is situated in the plane of the first metallization layer. The first electrical connection is arranged below the first metallization layer and is electrically connected to the signal input of the switching element of the ROM memory cell. The top side of the first electrical connection is arranged in such a way that the latter can be electrically contact-connected by means of suitably arranged metallic conductors within the first metallization layer.

Preferably, the first and second interconnects are spaced apart within the first metallization layer by an interspace in which the top side of the first electrical connection is spatially located. The top side of the first electrical connection lies in the first metallization layer. The first electrical connection abuts on a second electrical connection, which is situated in the plane of the first metallization layer in the interspace between the first and second interconnects, that is to say that the first electrical connection is spatially and electrically connected to the second electrical connection. In a manner dependent on the programming state of the ROM memory cell, the second electrical connection is connected to the first or the second interconnect and, consequently, in accordance with the programming state of the ROM memory cell, produces an electrical connection between either the first or the second interconnect and the first electrical connection and, consequently, also to the signal input of the switching element.

In this embodiment, the programming of the ROM memory cell according to the invention is effected by suitable patterning of the second electrical connection, which is part of the first metallization layer. The programming or reprogramming of the ROM memory cell according to the invention is thus effected by adapting the metal mask used for patterning the first metallization layer. In this case, the first metallization layer is not necessarily that metallization layer of the semiconductor element which is situated at the deepest position, but rather may be any arbitrary metallization layer of the integrated circuit which is situated further up. The further up the first metallization layer is situated in the integrated circuit, the later the point in time for programming occurs in the production process for the integrated circuit, that is to say the point in time at which the programming of the ROM memory cell is carried out. In this case, it is advantageous for the programming not to be carried out until at a latest possible point in time, in order to make possible reprogramming of the ROM memory cell cost-effective and less time-consuming.

As an alternative to the embodiment described above, it may also be provided that the top side of the first electrical connection abuts directly on the first or on the second interconnect in a manner dependent on the programming state of the ROM memory cell. Consequently, the first electrical connection is both spatially and electrically connected either to the first or to the second electrical interconnect. The first electrical connection is essentially situated directly below one of the two interconnects and electrically connects precisely one of the two interconnects to the signal input of the switching element. The programming of the ROM memory cell in this refinement therefore takes place by means of a suitable patterning of the first electrical connection or by means of a suitable selection of the spatial position of the first electrical connection. This refinement does not require a further electrical connection within the first metallization layer.

In another embodiment of the ROM memory cell according to the invention, the first electrical connection abuts on the signal input of the switching element, that is to say that it is spatially and electrically connected thereto. The first electrical connection is essentially arranged directly above the semiconductor region forming the signal input of the switching element and abuts by an underside on the signal input of the switching element. In this case, the bottommost metallization layer of the integrated circuit represents the first metallization layer and the first electrical connection is, in particular, a so-called contact connection which produces an electrical connection between the semiconductor layers and the bottommost metallization layer of the integrated circuit.

As an alternative to the contact connection, a patterned metal region lying in a second metallization layer may be electrically connected to the signal input of the switching element of the ROM memory cell. An underside of the first electrical connection abuts on the patterned metal region and is electrically and spatially connected thereto. The first metallization layer is formed by a metallization layer arranged above the patterned metal region, in particular by the metallization layer lying directly above the second metallization layer. The first electrical connection is situated between the first and second metallization layers and electrically connects the latter; in particular, the first electrical connection forms a so-called via connection arranged between two metallization layers lying one above the other.

In still another embodiment of the ROM memory cell according to the invention, the switching element of the ROM memory cell is formed by a MOSFET transistor. In this case, the source region of the MOSFET transistor forms the signal input of the switching element, the gate region forms the control input of the switching element, and the drain region forms the signal output of the control element.

In still another embodiment of the ROM memory cell according to the invention, the memory cell comprises at least one third metallization layer arranged below the first metallization layer. The third metallization layer forms, in particular, the bottommost metallization layer of the integrated circuit in which the ROM memory cell according to the invention is arranged. Consequently, neither the first nor the second metallization layer forms the bottommost metallization layer of the integrated circuit.

The ROM memory cell according to the invention is generally integrated on a common substrate and, in particular, is part of an integrated circuit.

In one embodiment, the ROM memory according to the invention has an arrangement (array) of ROM memory cells having at least one ROM memory cell according to the invention. In this case, the at least one ROM memory cell according to the invention, which provides a first predetermined potential or a second predetermined potential in the driven state in accordance with its programming state, can be read significantly faster than ROM memory cells in accordance with the prior art. Therefore, the ROM memory according to the invention overall can likewise be read significantly faster, particularly if predominantly or exclusively ROM memory cells according to the invention are used within the ROM memory according to the invention.

In another emboidment of the ROM memory according to the invention, the at least one ROM memory cell according to the invention is connected to a word line of the ROM memory according to the invention. The at least one ROM memory cell according to the invention is driven via the word line. Furthermore, the memory cell output of the at least one ROM memory cell according to the invention is connected to a bit line of the ROM memory according to the invention.

In still another embodiment according to the invention for programming a ROM memory cell, the invention comprises programming the ROM memory cell according to the invention by virtue of the ROM memory cell being designed in such a way that a first predetermined potential or a second predetermined potential is provided in a driven state at a memory cell output of the ROM memory cell in a manner dependent on the intended programming state of the ROM memory cell.

In the case of a mask-programmed ROM memory cell, the programming is effected during the production of the integrated circuit comprising the ROM memory cell according to the invention, with the aid of a suitable (lithographic) mask. In the case of a programmable (e.g. electrically programmable) ROM memory cell, the programming is effected by means of an explicit programming step after production of the integrated circuit.

BRIEF DESCRIPTION OF THE DRAWINGS

The invention is explained in more detail below with reference to the exemplary embodiments and figures, in which:

FIG. 1b shows a plan view of the ROM memory cell from FIG. 1a.

FIG. 4a shows a cross-sectional side view of a first exemplary embodiment of the ROM memory cell according to the invention.

FIG. 6a shows a cross-sectional side view of a third exemplary embodiment of the ROM memory cell according to the invention.

FIG. 6b shows a plan view of the exemplary embodiment from FIG. 6a in a first programming state.

FIG. 6c shows a plan view of the exemplary embodiment from FIG. 6a in a second programming state.

FIG. 7a shows a cross-sectional side view of a fourth exemplary embodiment of the ROM memory cell according to the invention.

DETAILED DESCRIPTION OF THE INVENTION

Figure 1A:
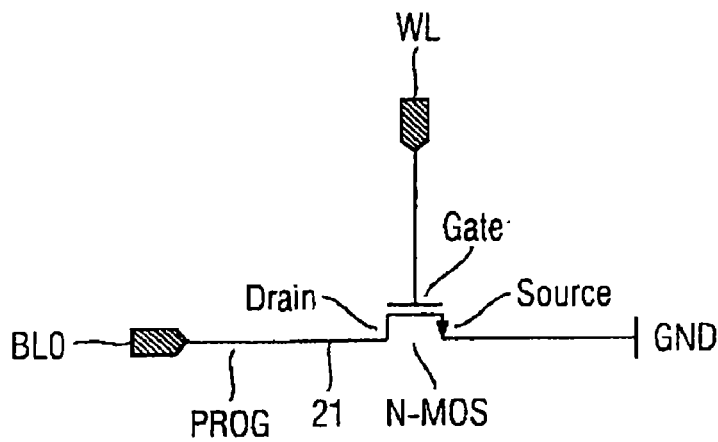
FIG. 1a shows a ROM memory cell in accordance with the prior art.
Figure 1B:
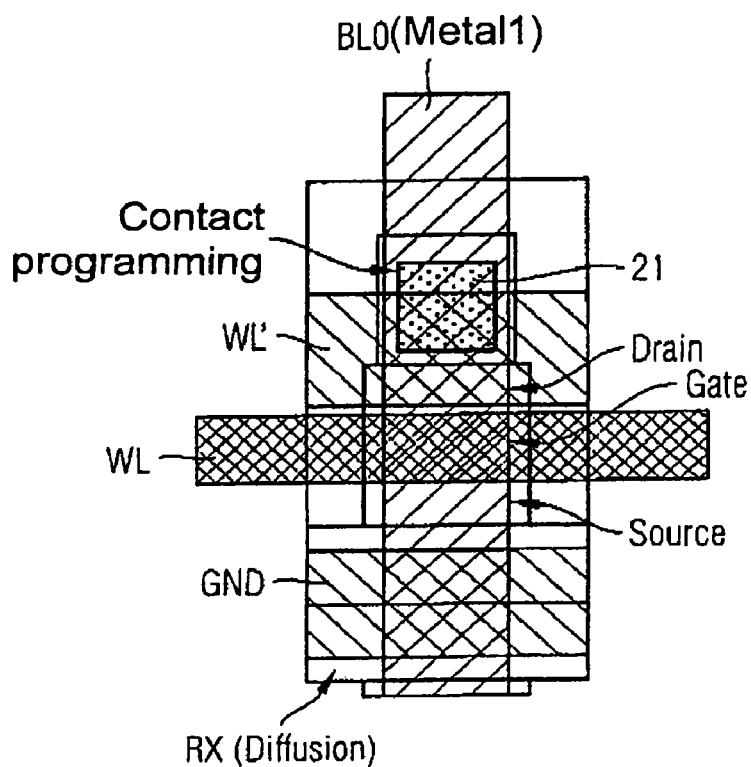
Figure 2:
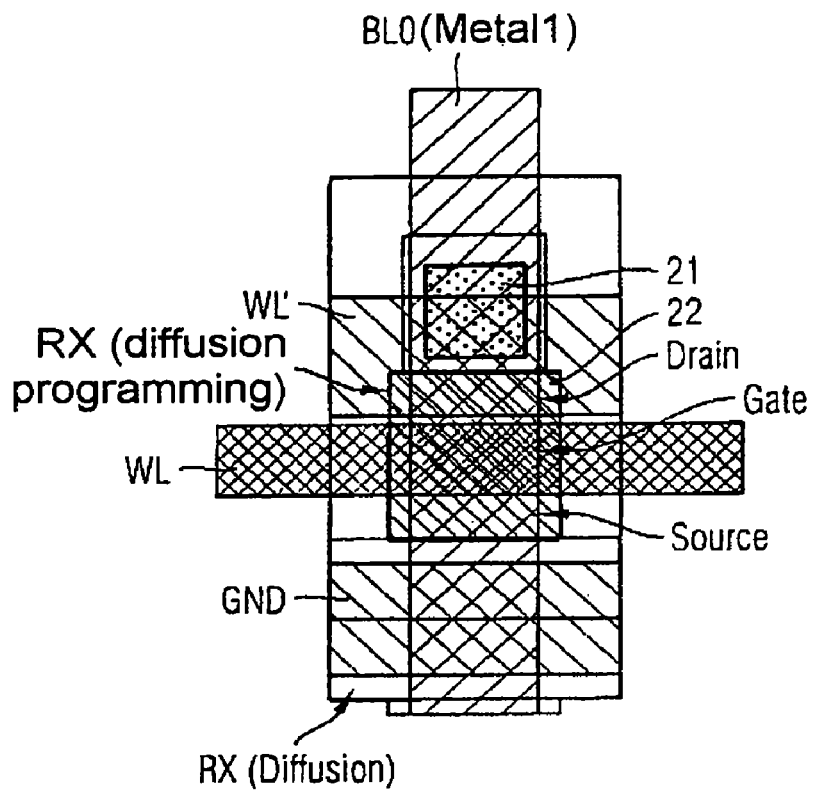
FIG. 2 shows a plan view of a further ROM memory cell in accordance with the prior art.
Figure 3:
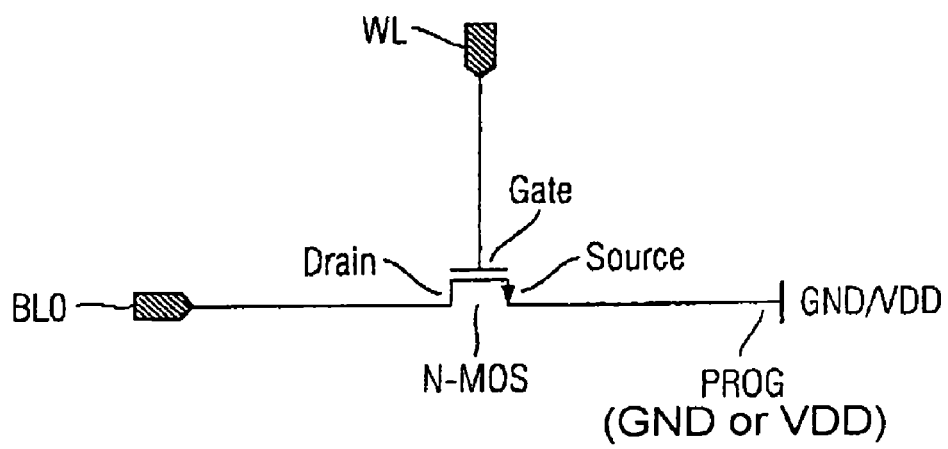
FIG. 3 shows one configuration of the ROM memory cell according to the invention.

FIG. 3 shows one configuration of the ROM memory cell according to the invention. The memory cell has a switching element formed by an NMOS transistor. The source region of the NMOS transistor forms the signal input of the switching element, the drain region of the NMOS transistor forms the signal output of the switching element and is fixedly connected to a bit line BL0. The gate region of the NMOS transistor forms the control input of the switching element and is fixedly connected to a word line WL. The source region of the transistor is connected to the supply voltage VDD or to earth GND, which respectively represent a logic 0 and a logic 1, in accordance with the programming of the ROM memory cell. The programming of the ROM memory cell takes place by means of the provision of precisely one electrical connection between the source region of the NMOS transistor and either the supply voltage VDD or earth GND. If the ROM memory cell is driven by the application of a suitable external signal to the word line WL then the transistor switches on, that is to say that the drain region is electrically connected to the source region of the transistor and the supply potential VDD or earth GND can be tapped off on the bit line BL0 in accordance with the source-side programming of the ROM memory cell. If the ROM memory cell is not driven, then the switching element is open, that is to say that the drain and source regions are electrically isolated, and no defined potential is present at the signal output of the switching element. The potential of the bit line BL0 is essentially not altered by non-driven ROM memory cells.

Figure 4B:
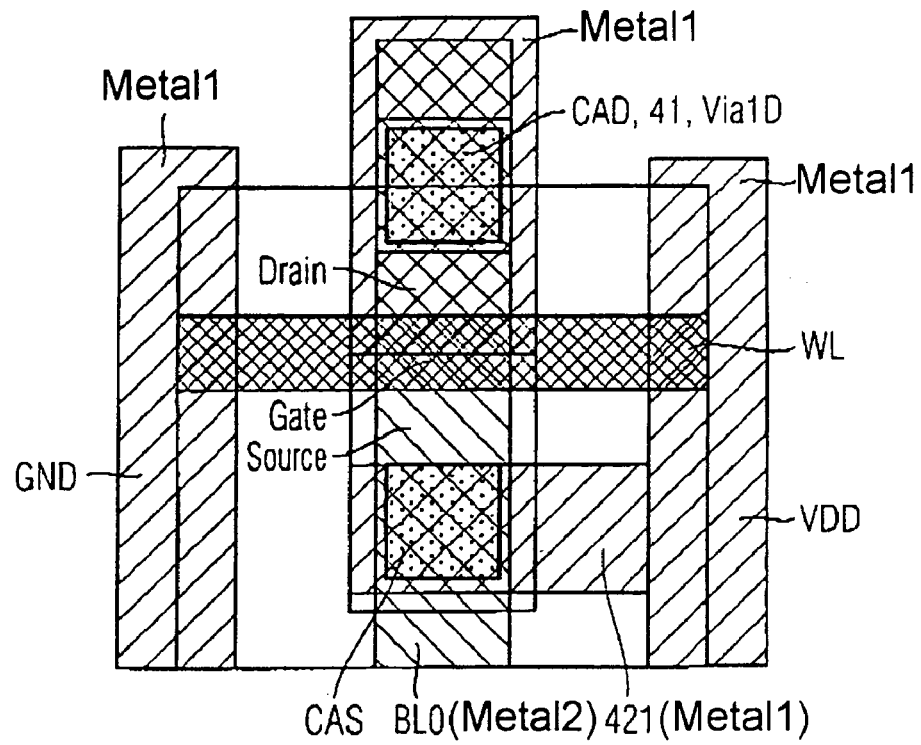
FIG. 4b shows a plan view of the exemplary embodiment from FIG. 4a in a first programming state.
Figure 4C:
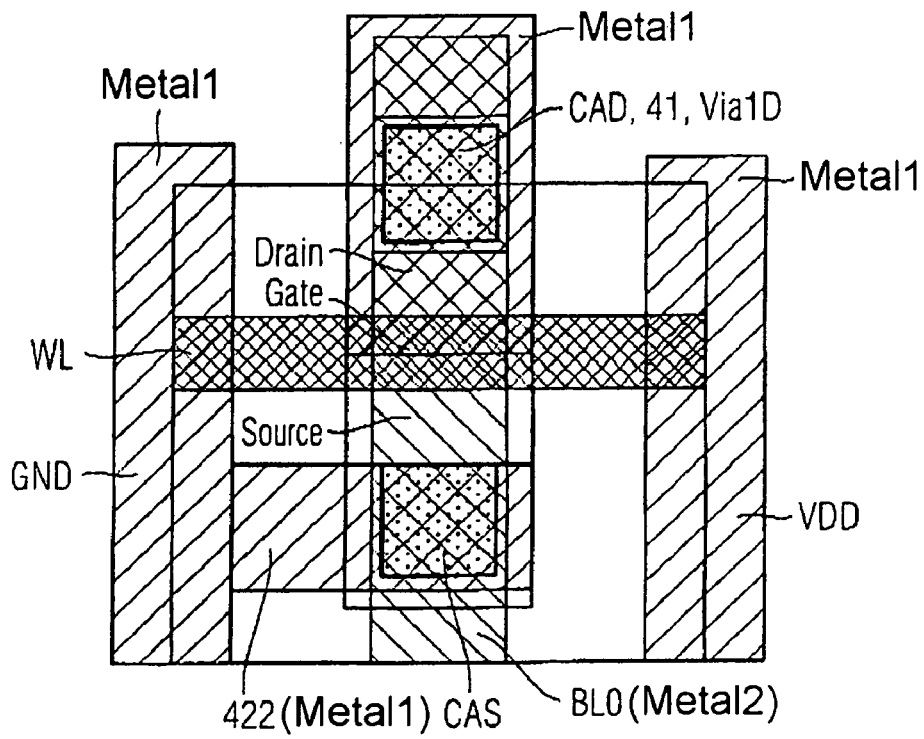
FIG. 4c shows a plan view of the exemplary embodiment from FIG. 4a in a second programming state.

FIG. 4a shows a side view of a first exemplary embodiment of the ROM memory cell according to the invention, FIG. 4b shows a plan view of the first exemplary embodiment from FIG. 4a in a first programming state, and FIG. 4c shows a plan view of the first exemplary embodiment in a second programming state. The lower part of FIG. 4a illustrates the semiconductor substrate in which the MOS transistor is formed within insulation regions. In the substrate, a diffusion region RX is formed and the drain region D, the gate region G and the source region S of the MOS transistor arise together with the word line formed in polysilicon PC. Two interconnects arranged parallel are situated in the bottommost metallization layer Metal1, the supply potential VDD and the earth potential GND respectively being applied to said interconnects. The two interconnects VDD and GND are spaced apart from one another perpendicular to the plane of the drawing of FIG. 4a and are shown slightly offset in the illustration in order to afford a better understanding. Situated above the drain region D of the MOS transistor is a contact connection CAD, which electrically connects the drain region to a patterned metal region 41 (landing pad) within the bottommost metallization layer Metal1. In this case, the contact connection CAD is spatially connected to the drain region D and the patterned metal region 41 and essentially runs vertically. A further essentially vertical electrical connection Via1D, in particular a so-called via connection, is formed above the patterned metal region 41 and connects the patterned metal region 41 to the overlying bit line BL0 within the overlying metallization layer Metal2. The bit line BL0 runs perpendicularly in FIGS. 4a and 4c. A further contact connection CAS is formed above the source region of the MOS transistor, the further contact connection being spatially and electrically connected to the source region S, and the top side of said further contact connection lying in the bottommost metallization layer Metal1. As can be seen from the plan views in FIGS. 4b and 4c, this contact connection lies spatially between the metallic interconnects VDD and GND. At its top side, the contact connection CAS abuts spatially against a further patterned metal region, which lies within the bottommost metallization layer, and which produces an electrical connection 421 to the supply potential VDD or 422 to the earth potential GND. Precisely one of the two patterned metal regions 421 or 422 is formed in accordance with the programming state of the ROM memory cell. Consequently, in accordance with the intended programming state of the ROM memory cell, an electrical connection is produced between the source region S of the transistor and either the supply potential VDD or the earth potential GND, as has already been shown schematically in FIG. 3.

In the present exemplary embodiment, the programming of the ROM memory cell according to the invention takes place exclusively by means of a suitable patterning of the metal regions 421/422 in the bottommost metallization layer Metal1. The ROM memory can therefore be reprogrammed by solely adapting the metal mask for the bottommost metallization layer Metal1. Other lithographic masks do not have to be altered. This exemplary embodiment furthermore has the advantage that a ROM memory containing ROM memory cells in accordance with the first exemplary embodiment can be realized with a total of just three metallization layers. It is also advantageous that the leads from the drain regions of the transistors to the bit line BL0 are short and the bit line BL0 therefore has only a small capacitance, which permits a higher read-out speed.

Figure 5A:
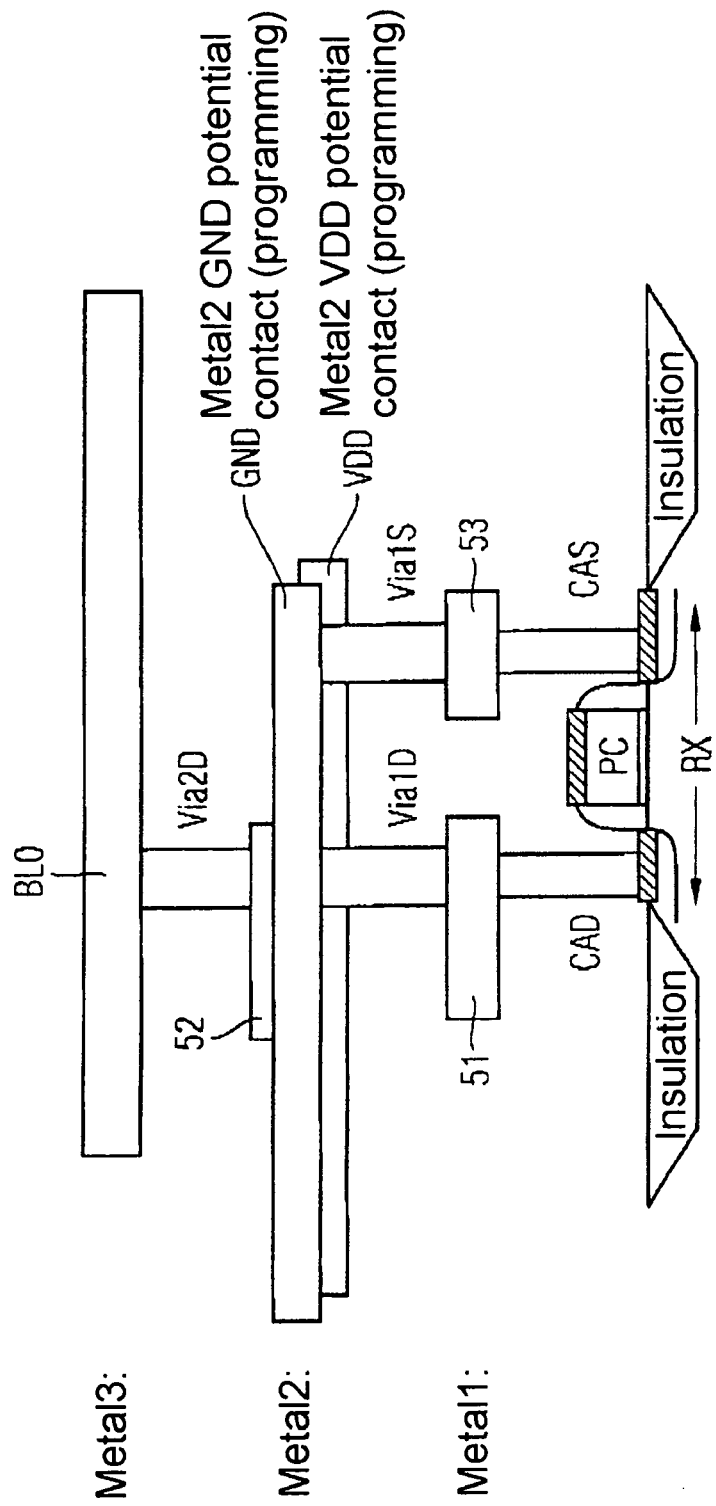
FIG. 5a shows a cross-sectional side view of a second exemplary embodiment of the ROM memory cell according to the invention.
Figure 5B:
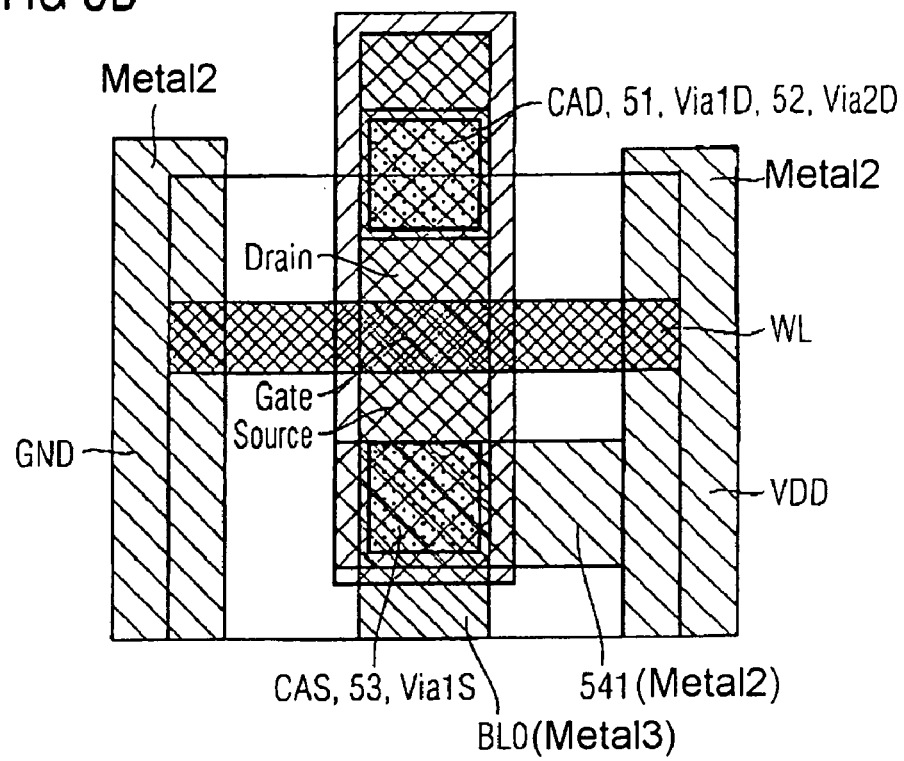
FIG. 5b shows a plan view of the exemplary embodiment from FIG. 5a in a first programming state.
Figure 5C:
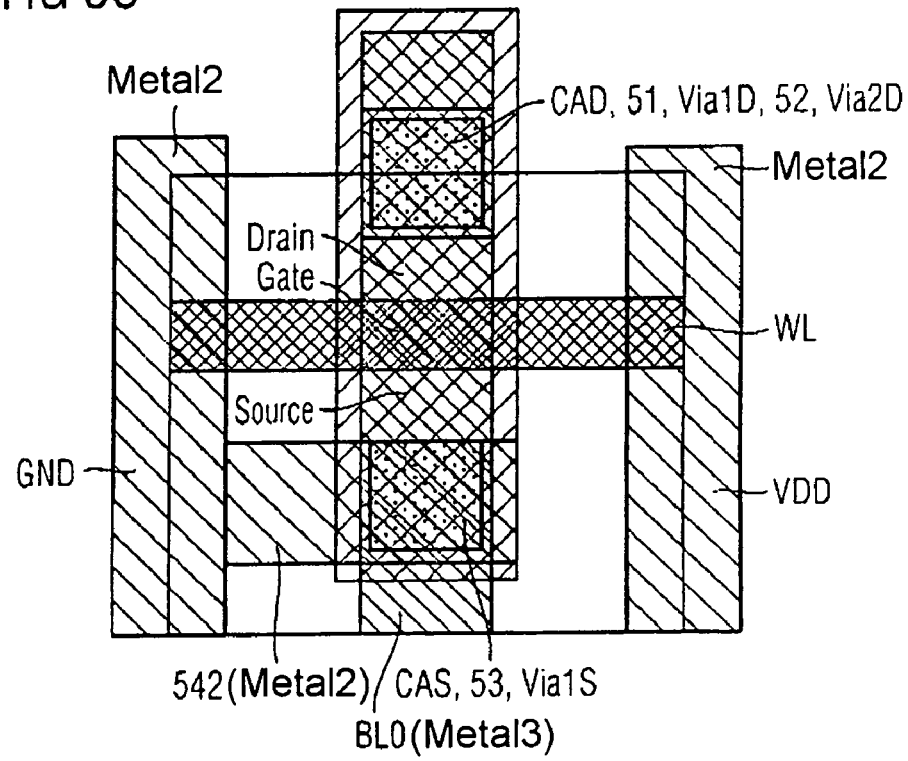
FIG. 5c shows a plan view of the exemplary embodiment from FIG. 5a in a second programming state.

FIGS. 5a, 5b and 5c illustrate a second exemplary embodiment of the ROM memory cell according to the invention. The bit line BL0 is situated in the third from bottom metallization layer Metal3 and runs perpendicularly in FIGS. 5b and 5c. The drain region of the transistor is electrically connected to the bit line BL0 by means of the contact connection CAD, the patterned metal region 51, the via connection Via1D, the further patterned metal region 52 and the further via connection Via2D. In plan view, the various electrical connections that connect the drain region of the transistor to the bit line BL0 lie spatially between the interconnects VDD and GND. The interconnects VDD and GND, to which the supply potential VDD and the earth potential GND are applied, are situated in the second from bottom metallization layer Metal2. The source region of the transistor is connected to the second from bottom metallization layer Metal2 by means of the contact connection CAS, the patterned metal region 53 and the via connection Via1S. Either the metal region 541 or the metal region 542 is formed within the second from bottom metallization layer Metal2 in accordance with the programming state of the ROM memory cell, whereby an electrical connection is formed either between the interconnect to which the supply voltage VDD is applied or the interconnect to which the earth potential GND is applied and the source region of the transistor.

This second exemplary embodiment differs from the first exemplary embodiment illustrated in FIGS. 4a to 4c essentially by virtue of the fact that an additional metallization layer Metal1 is provided, which is arranged below the metallization layers of the first exemplary embodiment, as a result of which the metallization layers known from the first exemplary embodiment move upwards. In particular, in the second exemplary embodiment, additional patterned metal regions 51 and 53 are provided in the bottommost metallization layer Metal1 and additional via connections Via1D and Via2D are provided, which connect the metallization layer Metal1 to the metallization layer Metal2. The programming of the ROM memory cell takes place within the second from bottom metallization layer Metal2 on the basis of the patterned metal regions 541 and 542, respectively.

The reprogramming of the ROM memory cell according to the invention in accordance with the second exemplary embodiment therefore requires merely an adaptation of the metal mask of the second from bottom metallization layer Metal2. Other lithographic masks do not have to be altered for the reprogramming of the ROM memory cells.

The second exemplary embodiment has the advantage over the first exemplary embodiment that the programming takes place not in the bottommost but rather in the second from bottom metallization layer and thus at a later point in time during the production of the integrated circuit comprising the ROM memory cell. This makes reprogramming less complicated and more cost-effective by comparison with the first exemplary embodiment, reduces the number of work steps required for reprogramming, and reduces the time expenditure required for reprogramming (turnaround time).

The programming can also be shifted into metallization layers situated in even higher positions, as a result of which the programming is shifted to even later points in time during the production of the integrated circuit comprising the ROM memory cell and the abovementioned advantages of the second exemplary embodiment are enhanced still further.

FIGS. 6a to 6c illustrate a third exemplary embodiment of the ROM memory cell according to the invention. The interconnects to which the supply potential VDD and the earth potential GND are applied run in the bottommost metallization layer Metal1 and cross the source region of the MOS transistor, that is to say that they run in sections essentially above the source region of the transistor. The programming of the ROM memory cell in accordance with the third exemplary embodiment takes place by virtue of the fact that precisely one of the two contact connections CAS1 or CAS2 depicted in FIG. 6a is formed in accordance with the intended programming state of the ROM memory cell, as a result of which an electrical contact is produced between the source region of the MOS transistor and either the supply potential VDD or the earth potential GND. In this case, the source region of the MOS transistor can be made somewhat larger, as illustrated in FIGS. 6a to 6c, in order to be able to accommodate both contact connections CAS1 and CAS2. As in the first exemplary embodiment, the bit line BL0 is situated in the second from bottom metallization layer Metal2 and runs perpendicularly in FIGS. 6b and 6c.

As already in the first exemplary embodiment, the spatially short electrical connection from the drain region to the bit line BL0 by means of the contact connection CAD, the patterned metal region 61 and the via connection Via1 adds a small capacitance to the bit line BL0. Consequently, a ROM memory having ROM memory cells according to the invention in accordance with the third exemplary embodiment can be realized with a total of just three metallization layers cost-effectively and in a favourable manner in respect of outlay.

The side view of the third exemplary embodiment as shown in FIG. 6a depicts both contact connections CAS1 and CAS2 in order to afford a better understanding. However, of these two contact connections one contact connection CAS1 or CAS2 is realized in accordance with the intended programming state of the respective ROM memory cell. The programming or reprogramming of the ROM memory cell in accordance with the third exemplary embodiment takes place by means of a suitable adaptation of the contact mask during the production of the integrated circuit.

Figure 7B:
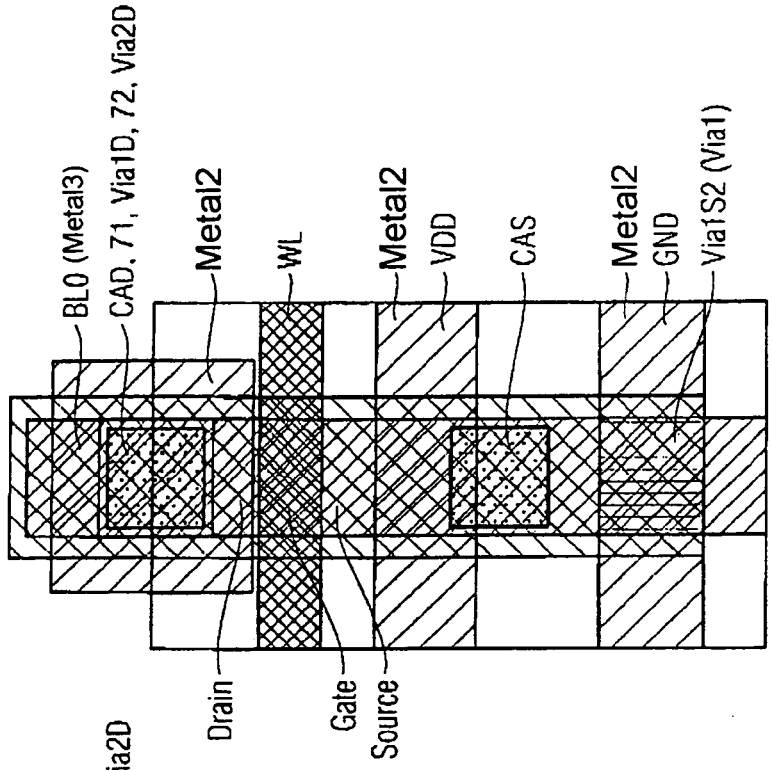
FIG. 7b shows a plan view of the exemplary embodiment from FIG. 7a in a first programming state.
Figure 7C:
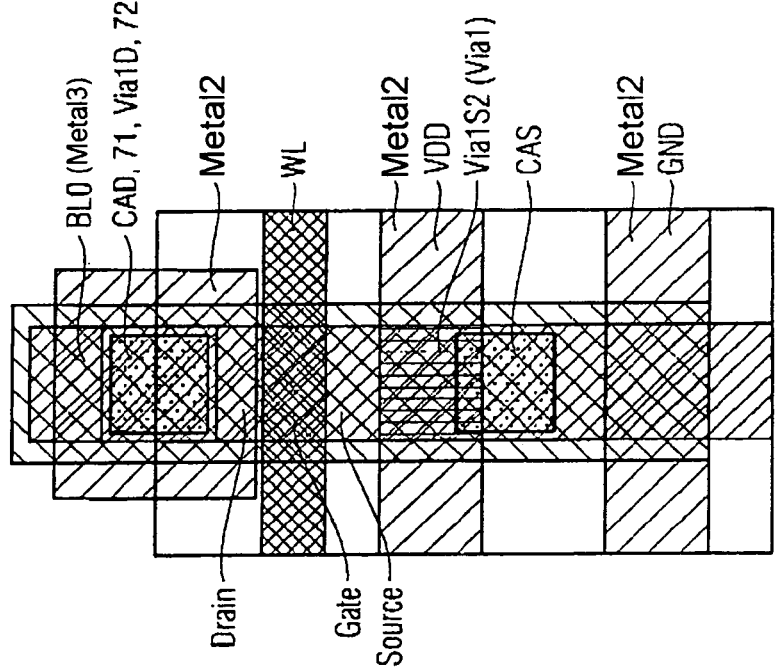
FIG. 7c shows a plan view of the exemplary embodiment from FIG. 7a in a second programming state.

FIGS. 7a to 7c illustrate a fourth exemplary embodiment of the ROM memory cell according to the invention. This fourth exemplary embodiment differs from the third exemplary embodiment illustrated in FIGS. 5a to 5c essentially by virtue of the fact that an additional metallization layer Metal1 is provided, which is arranged below the metallization layers of the third exemplary embodiment, as a result of which the metallization layers already known from the third exemplary embodiment move upwards.

The drain region of the MOS transistor is connected to the bit line BL0, which lies in the third from bottom metallization layer Metal3, by means of a contact connection CAD, two patterned metal regions 71 and 72, respectively situated in the metallization layers Metal1 and Metal2, and via connections Via1D and Via2D. The bit line BL0 runs perpendicularly in the plan views in FIGS. 7b and 7c. A contact connection CAS leads from the source region of the MOS transistor to a further patterned metal region 73 in the bottommost metallization layer Metal1. The interconnects to which the supply potential VDD and the earth potential GND are applied run in the second from bottom metallization layer Metal2 and cross the patterned metal region 73, that is to say that they run in sections essentially above the patterned metal region 73 arranged within the bottommost metallization layer Metal 1.

The programming of this ROM memory cell takes place by virtue of the fact that precisely one of the two via connections Via1S1 or Via2S2 depicted in FIG. 7a is formed above the patterned metal region 73, as a result of which an electrical connection is produced between the source region of the MOS transistor and either the supply potential VDD or the earth potential GND. The programming of the ROM memory cell in accordance with the fourth exemplary embodiment takes place by means of a suitable adaptation of the via mask for the via connections between the bottommost metallization layer Metal1 and the overlying metallization layer Metal2.

The fourth exemplary embodiment has the advantage over the previously discussed exemplary embodiments that the production of a via mask is the most cost-effective in comparison with the production of the metal mask used in the first and second exemplary embodiments and the contact mask used in the third exemplary embodiment. In addition, in comparison with the third exemplary embodiment, the reprogramming takes place during production at a later point in time, as a result of which the reprogramming becomes more favourable in respect of outlay and more cost-effective. This exemplary embodiment affords high flexibility with regard to a reprogramming of the ROM memory cells and enables short "turnaround" times.

Furthermore, the programming can be shifted into layers of the integrated circuit which lie in a higher position by means of inserting further metallization layers below the metallization layer which is identified as the bottommost metallization layer Metal1 in FIG. 7a. As a result, the programming can be shifted to even later points in time during production, which further reduces the costs and the outlay for a possible reprogramming. Very short "turn-around" times for the reprogramming of the ROM memory cells and high flexibility are thereby achieved.

The programming on the basis of metal masks that is discussed in the first and second exemplary embodiments affords the advantage over the third exemplary embodiment that the production of a metal mask is more cost-effective than the production of a contact mask. In addition, the programming on the basis of a metal mask affords the advantage that the defect densities for this process are lower than the process defect densities for contact or via planes.

Furthermore, it is conceivable to provide a selection from more than two potentials for the programming. A ROM memory cell according to the invention may be designed to provide a potential from a multiplicity of potentials (for example four or more) at the memory cell output.

What is claimed is:

1. A ROM memory cell of a ROM memory, comprising:
   at least one of a first predetermined potential or a second predetermined potential in a driven state at a memory cell output dependent on a programming state of the ROM memory cell;
   a switching element including:
      a signal input, at which the at least one first predetermined potential or the second predetermined potential is present in a manner dependent on the programming state of the ROM memory cell, and
      a signal output for reading out the programming state of the ROM memory cell, which is connected to the signal input in the driven state;
   a first interconnect, to which the first predetermined potential is applied, and a second interconnect, to which the second predetermined potential is applied, the signal input of the switching element being electrically connected to the first interconnect or the second interconnect dependent on the programming state of the ROM memory cell;
   a first metallization layer, in which the first interconnect and the second interconnect are arranged above the switching element; and
   a first electrical connection, which is electrically connected to the signal input of the switching element and has a top side situated in the plane of the first metallization layer;
   wherein:
   the top side of the first electrical connection is arranged spatially between the first interconnect and the second interconnect,
   a second electrical connection is arranged in the plane of the first metallization layer and the first electrical connection abuts on the second electrical connection, and
   the second electrical connection is connected to the first interconnect or the second interconnect dependent on the programming state of the ROM memory cell.

2. The ROM memory cell according to claim 1, wherein the signal output of the switching element is connected to the memory cell output.

3. The ROM memory cell according to claim 1, wherein the switching element has a control input, which can be fed with a control signal, and the control signal drives the ROM memory cell.

4. The ROM memory cell according to claim 1, wherein the first predetermined potential represents a logic one and the second predetermined potential represents a logic zero.

5. The ROM memory cell according to claim 1, wherein the first predetermined potential is formed by the supply voltage and the second predetermined potential is formed by earth.

6. The ROM memory cell according to claim 1, wherein the top side of the first electrical connection abuts on the first interconnect or on the second interconnect dependent on the programming state of the ROM memory cell.

7. The ROM memory cell according to claim 1, wherein the switching element comprises a MOSFET transistor, a source region of which forms the signal input of the switching element, a gate region of which forms the control input of the switching element and a drain region of which forms the signal output of the switching element.

8. The ROM memory cell according to claim 1, wherein at least one third metallization layer is arranged below the first metallization layer.

9. The ROM memory cell according to claim 1, wherein the ROM memory cell is integrated on a common substrate.

10. A ROM memory, comprising an arrangement of ROM memory cells which has:
  at least one ROM memory cell including at least one of a first predetermined potential or a second predetermined potential in a driven state at a memory cell output dependent on a programming state of the ROM memory cell;
  a switching element including:
    a signal input, at which the at least one first predetermined potential or the second predetermined potential is present in a manner dependent on the programming state of the ROM memory cell, and
    a signal output for reading out the programming state of the ROM memory cell, which is connected to the signal input in the driven state;
  a first interconnect, to which the first predetermined potential is applied, and a second interconnect, to which the second predetermined potential is applied, the signal input of the switching element being electrically connected to the first interconnect or the second interconnect dependent on the programming state of the ROM memory cell;
  a first metallization layer, in which the first interconnect and the second interconnect are arranged above the switching element; and
  a first electrical connection, which is electrically connected to the signal input of the switching element and has a top side situated in the plane of the first metallization layer;
  wherein:
  the top side of the first electrical connection is arranged spatially between the first interconnect and the second interconnect,
  a second electrical connection is arranged in the plane of the first metallization layer and the first electrical connection abuts on the second electrical connection, and
  the second electrical connection is connected to the first interconnect or the second interconnect dependent on the programming state of the ROM memory cell.

11. The ROM memory according to claim 10, wherein a control input of a switching element of the at least one ROM memory cell is connected to a word line of the ROM memory, and
  the at least one ROM memory cell is driven via the word line.

12. The ROM memory according to claim 10, wherein a memory cell output of the at least one ROM memory cell is connected to a bit line of the ROM memory.

* * * * *